United States Patent [19]
Saito et al.

[11] Patent Number: 5,723,998
[45] Date of Patent: Mar. 3, 1998

[54] ELECTRONIC CIRCUIT WITH OPERATION SELF-CONTROL FUNCTION

[75] Inventors: Akitoshi Saito; Shigemitsu Yamaoka; Ryo Kamiya, all of Shizuoka, Japan

[73] Assignee: Yamaha Corporation, Hamamatsu, Japan

[21] Appl. No.: 508,975

[22] Filed: Jul. 28, 1995

[30] Foreign Application Priority Data

Aug. 10, 1994 [JP] Japan .................. 6-209259
Aug. 10, 1994 [JP] Japan .................. 6-209260

[51] Int. Cl.$^6$ .................. H01L 35/00; H03K 3/42
[52] U.S. Cl. .................. 327/513; 327/362
[58] Field of Search .................. 327/513, 83, 138, 327/262, 378, 362, 512

[56] References Cited

U.S. PATENT DOCUMENTS

| | | | |
|---|---|---|---|
| 3,492,586 | 1/1970 | Leffmann | 327/138 |
| 3,938,316 | 2/1976 | Morokawa et al. | 327/83 |
| 4,667,121 | 5/1987 | Fay et al. | 327/83 |
| 4,791,380 | 12/1988 | Chiappetta | 327/513 |
| 5,233,161 | 8/1993 | Farwell et al. | 219/209 |
| 5,440,520 | 8/1995 | Schutz et al. | 327/513 |
| 5,451,892 | 9/1995 | Bailey | 327/83 |
| 5,469,561 | 11/1995 | Takeda | 395/550 |
| 5,475,325 | 12/1995 | Nezu | 327/362 |
| 5,485,127 | 1/1996 | Bertoluzzi et al. | 331/69 |
| 5,490,059 | 2/1996 | Mahalingaiah et al. | 364/166 |
| 5,600,612 | 2/1997 | Saito et al. | 369/13 |

*Primary Examiner*—Toan Tran
*Attorney, Agent, or Firm*—Loeb & Loeb LLP

[57] ABSTRACT

An electronic circuit with an operation self-control function includes an electronic circuit body. A temperature sensor and a temperature-setting circuit detect the temperature of the electronic circuit body as an operating parameter indicative of an operating condition of the electronic circuit body, and a clock/peripheral circuit control circuit operates to restrict the operation of the electronic circuit body according to the detected temperature, to thereby restrain heat generation of the electronic circuit body.

22 Claims, 7 Drawing Sheets

ELECTRONIC CIRCUIT WITH OPERATION SELF-CONTROL FUNCTION

BACKGROUND OF THE INVENTION

1. Field of the Invention

This invention relates to an electronic circuit with an operation self-control function of controlling its own operation according to operating conditions such as the temperature of the circuit or the ambient temperature.

2. Prior Art

Conventionally, there is an increasing demand for measures for restraining heat generation from LSI's (Large Scale Integrated Circuits), due to recent increased integration of LSI's and use of higher frequency clocks in LSI's. In large-scale computers using ECL's(Emitter Coupled Logics), it has been employed to forcibly cool LSI's by means of a fleon gas or a fan.

The above conventional cooling method, however, has the disadvantage that in the event of failure of the fan or in the event that the temperature within the computer rises abnormally above the design limit value, it can fatally affect the operation of the system such that the entire system breaks down.

On the other hand, processors in general vary in processing capacity depending upon an operating environment in which they are operated, such as the ambient temperature and the driving voltage. Conventionally, the frequency of a clock for operating a processor is set to such a value that the processor can operate even when it is placed under the worst operating environment. For example, transistors used in a processor decrease in switching speed with an increase in the ambient temperature. Therefore, in view of the possible use of the processor in the compartment of an automotive vehicle or a like environment where the ambient temperature can rise to a considerably high value, the clock frequency has to be set to a fairly low value for safety's sake.

However, if the clock frequency is set to such a low value in view of the possible use of the processor in the worst environmental condition, the processing capacity of the processor cannot be fully exhibited when the processor is used in a normal operating environmental condition where the ambient temperature assumes a room temperature, even if the processor has a potential capacity twice as large as a capacity which can be exhibited in the worst environmental condition.

SUMMARY OF THE INVENTION

It is the object of the invention to provide an electronic circuit with an operation self-control function of controlling its own operation according to an operating condition in which it is operated, such as the temperature of the circuit or the ambient temperature, to thereby restrain its own heat generation and/or fully exhibit its processing capacity according to the operating condition.

To attain the above object, the present invention provides an electronic circuit with an operation self-control function comprising an electronic circuit body, operating parameter-detecting means for detecting a value of an operating parameter indicative of an operating condition of the electronic circuit body, and control means for restricting operation of the electronic circuit body according to the detected value of the operating parameter.

Preferably, the operating parameter-detecting means detects processing capacity of the electronic circuit body attributable to an operating environment in which the electronic circuit body operates.

Also preferably, the operating parameter-detecting means comprises a temperature sensor for sensing temperature of the electronic circuit body.

Alternatively, the operating parameter-detecting means comprises a voltage sensor for detecting voltage for driving the electronic circuit body.

Preferably, the operating parameter-detecting means is provided in the electronic circuit body.

Advantageously, the electronic circuit according to the invention includes clock-generating means for generating a clock on which the electronic circuit body operates. The control means is responsive to the detected value of the operating parameter, for controlling frequency of the clock from the clock-generating means.

More specifically, the operating parameter-detecting means comprises a temperature sensor for sensing temperature of the electronic circuit body, and the control means lowers the frequency of the clock when the detected temperature of the electronic circuit body exceeds a predetermined value.

In the case where the electronic circuit body has a plurality of different functions, together with lowering the frequency of the clock or alternatively of lowering the frequency of the clock, the control means inhibits execution of at least one of the plurality of different functions when the detected temperature of the electronic circuit body exceeds a predetermined value.

In another form of the invention, the control means controls a processing amount per unit time of the electronic circuit body according to the detected processing capacity.

For example, in the case where the electronic circuit body is capable of carrying out a plurality of different tasks, the control means inhibits execution of at least one of the plurality of the different tasks, depending upon the detected processing capacity. Alternatively, the control means changes priority of at least one of the plurality of the different tasks, depending upon the detected processing capacity.

Alternatively, to control the processing capacity, the control means controls frequency of the clock from the clock-generating means according to the detected temperature of the electronic circuit body.

In one preferred embodiment of the invention, the electronic circuit according to the invention comprises an electronic circuit body, temperature-detecting means for detecting temperature of the electronic circuit body, and control means for restricting operation of at least part of the electronic circuit body when the detected temperature of the electronic circuit body exceeds a predetermined value.

Preferably, the electronic circuit is an integrated circuit.

In another preferred embodiment of the invention, the electronic circuit according to the invention comprises an electronic circuit body, processing capacity-detecting means for detecting processing capacity of the electronic circuit body attributable to an operating environment in which the electronic circuit body operates, and control means for controlling a processing amount per unit time of the electronic circuit body according to the detected processing capacity.

Preferably, the electronic circuit is a processor.

The above and other objects, features, and advantages of the invention will be more apparent from the following detailed description taken in conjunction with the accompanying drawings.

DETAILED DESCRIPTION

The invention will now be described in detail with reference to the drawings showing preferred embodiments thereof.

Figure 1:
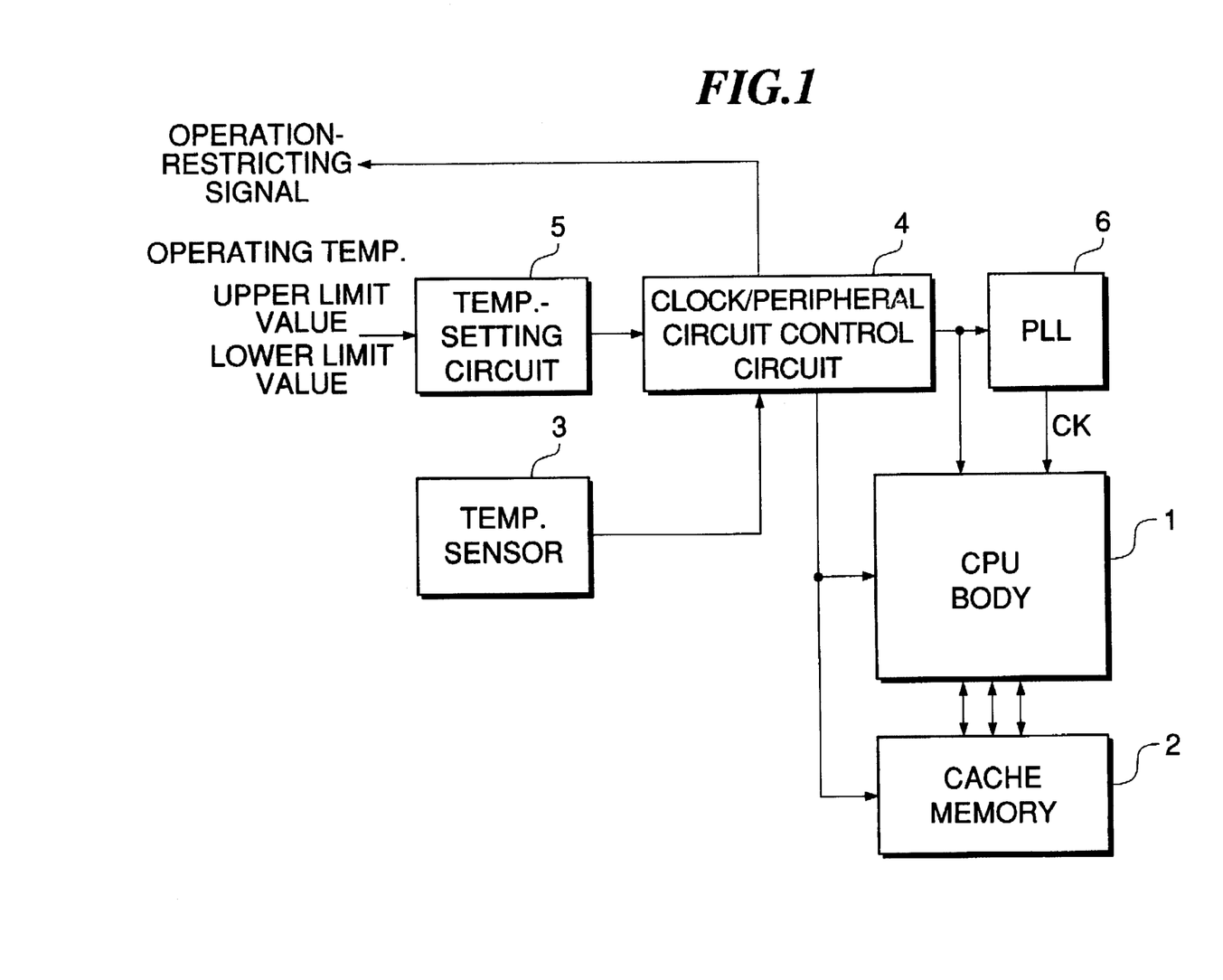
FIG. 1 is a block diagram showing the arrangement of an integrated circuit as an electronic circuit with an operation self-control function according to a first embodiment of the invention.

Referring first to FIG. 1, there is shown the arrangement of an integrated circuit with a heat generation self-refraining function embodying an electronic circuit with an operation self-control function according to a first embodiment of the invention.

In the figure, reference numeral 1 designates a CPU body which is subjected to heat generation self-control according to the invention. Connected to the CPU body 1 are a cache memory 2 for realizing high-speed operation, a clock/peripheral circuit control circuit 4, and a PLL (Phase Locked Loop) 6 for generating a clock signal on which the integrated circuit operates. These components of the integrated circuit are formed in a chip. A temperature sensor 3 is also formed in the same chip in which the CPU 1, etc. are formed. The temperature sensor 3 senses the temperature of the chip and supplies the detected temperature value to the clock/peripheral circuit control circuit 4. The integrated circuit further includes a temperature-setting circuit 5 which stores upper and lower limit values of operating temperature which are set by external setting means, not shown, such as a RAM, a non-volatile RAM, a fuse ROM, or laser trimming. Also the set upper and lower limit values are supplied to the clock/peripheral circuit control circuit 4.

The clock/peripheral circuit control circuit 4 controls the operation of the integrated circuit such that the temperature detected by the temperature sensor 3 lies between the upper and lower limit values set by the temperature-setting circuit 5. More specifically, the clock/peripheral circuit control circuit 4 delivers to the PLL 6 a command for lowering the frequency of the clock signal CK when the temperature of the chip exceeds the upper limit value. In addition to or in place of lowering the frequency of the clock signal CK, the cache memory 2 may be stopped from functioning. As a result, the heat generation can be restrained, though the processing speed of the CPU 1 more or less lowers. Further, the clock/peripheral circuit control circuit 4 delivers a signal indicating that the system is in an operation-restricted state, to an external circuit or an OS (Operation System), not shown, as well as to the CPU 1. The operations of the external circuit or the OS and the CPU 1 are interrupted by the signal delivered thereto so that these circuits start operations in operation-restricted mode. When the temperature of the chip drops below the lower limit value, the clock/peripheral circuit control circuit 4 delivers a command for canceling the operation-restricted mode to the external circuit or the OS and the CPU 1 so that these circuits cancel the operation-restricted mode and carry out normal operations.

Figure 2:
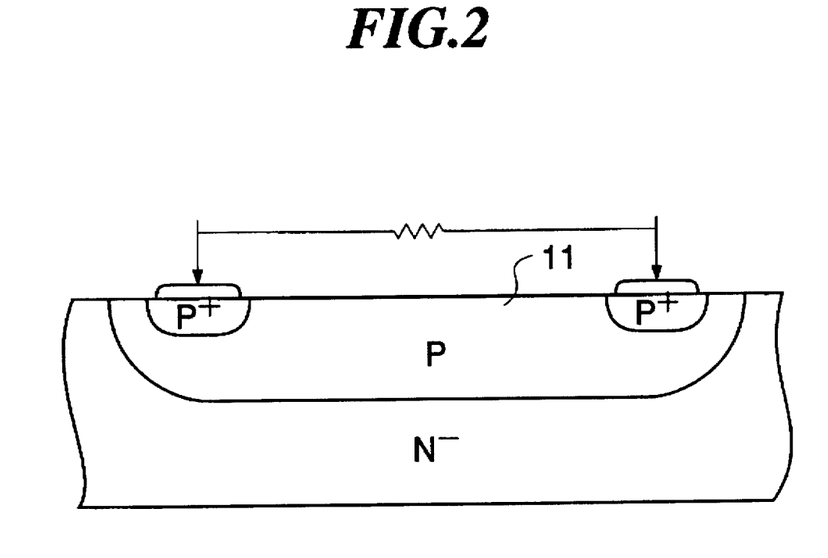
FIG. 2 is a schematic fragmentary view showing the construction of an example of a temperature sensor employed in the circuit of FIG. 1.
Figure 3:
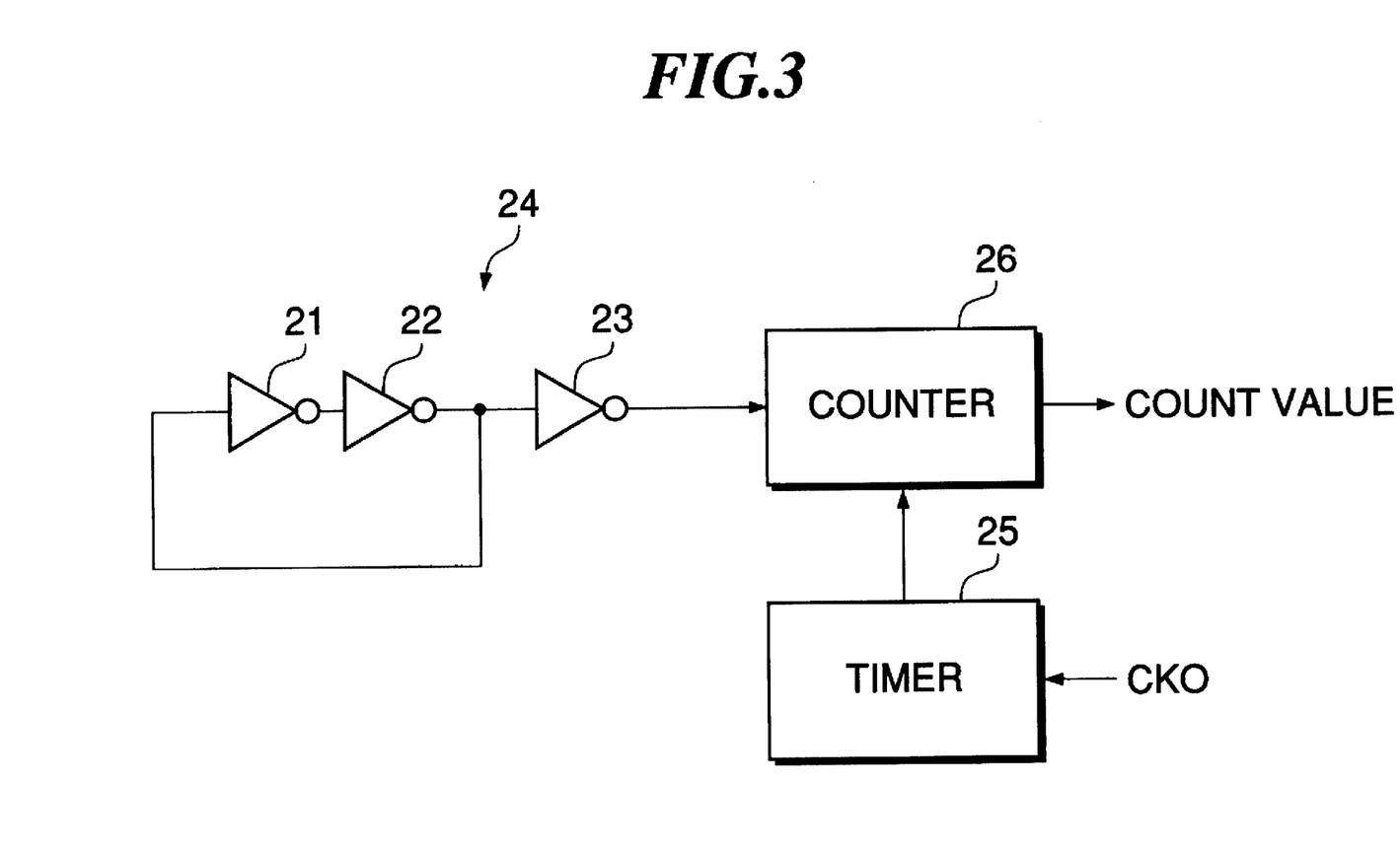
FIG. 3 is a block diagram showing the arrangement of another example of the temperature sensor.

The temperature sensor 3 detects the temperature of the chip in the following manner: If the integrated circuit is formed of a bipolar LSI which has a positive temperature vs. current characteristic, a value of current flowing between specific points is measured. For example, as shown in FIG. 2, a resistance value between two electrodes of a diffusion layer 11 is measured, and the temperature is calculated from the measured resistance value. If the integrated circuit is formed of a MOS, as shown in FIG. 3 for example, an output from an oscillator circuit 24 formed of inverters 21, 22, 23 formed by MOS transistors and serially connected to each other and to a counter 26 is counted by the counter 26 over a predetermined time period set by a timer 25, and the temperature is calculated from the count value. The timer 25 is driven by a reference clock CK0 to set the predetermined time period irrespective of the temperature. With the above arrangement, as the temperature rises and accordingly the switching time of the transistors becomes longer, the oscillation frequency decreases so that the count value assumes a value inversely proportional to the temperature.

By thus providing a built-in temperature sensor in the chip, the temperature within the chip can be accurately detected.

Figure 4:
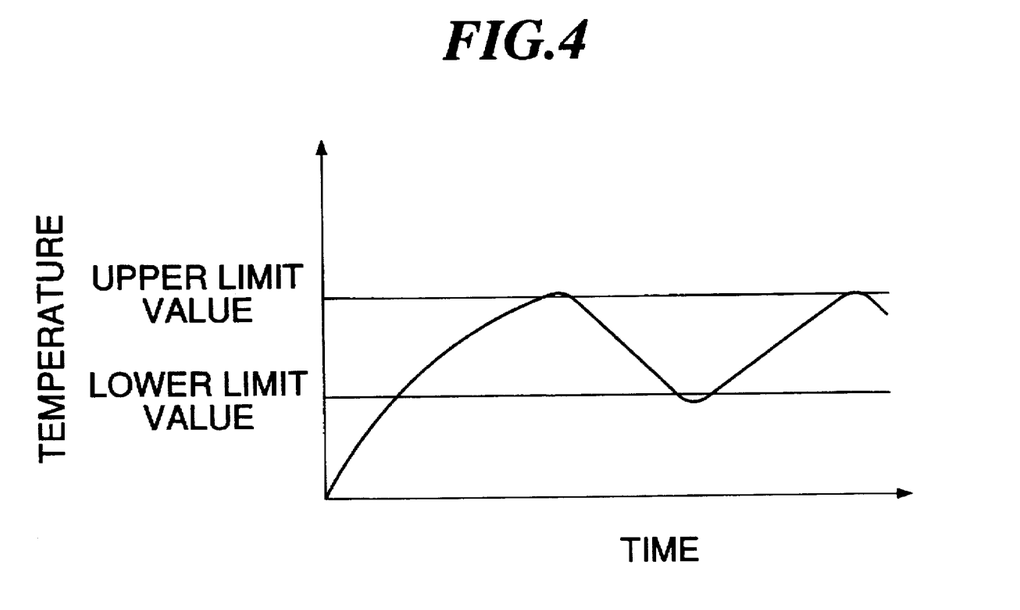
FIG. 4 is a graph showing a temperature vs. time characteristic of the circuit.

According to the integrated circuit of the present embodiment, as shown in FIG. 4, the chip operates by itself to maintain its own temperature between the upper and lower limit values which are set in advance. As a result, the heat generation from the integrated circuit can be effectively suppressed even without using another type cooling means or by the use of another type cooling means together with the above described temperature sensor means.

As described above, according to the present embodiment, temperature-detecting means (temperature sensor 3 and temperature-setting circuit 5) detects the temperature of the integrated circuit body, and when the detected temperature falls outside a predetermined temperature range, control means (clock/peripheral circuit control circuit 4) operates to restrict operation of at least part of the integrated circuit body. In other words, the integrated circuit operates by itself to restrain its own heat generation so that the temperature of the integrated circuit is maintained within the predetermined temperature range.

Figure 5:
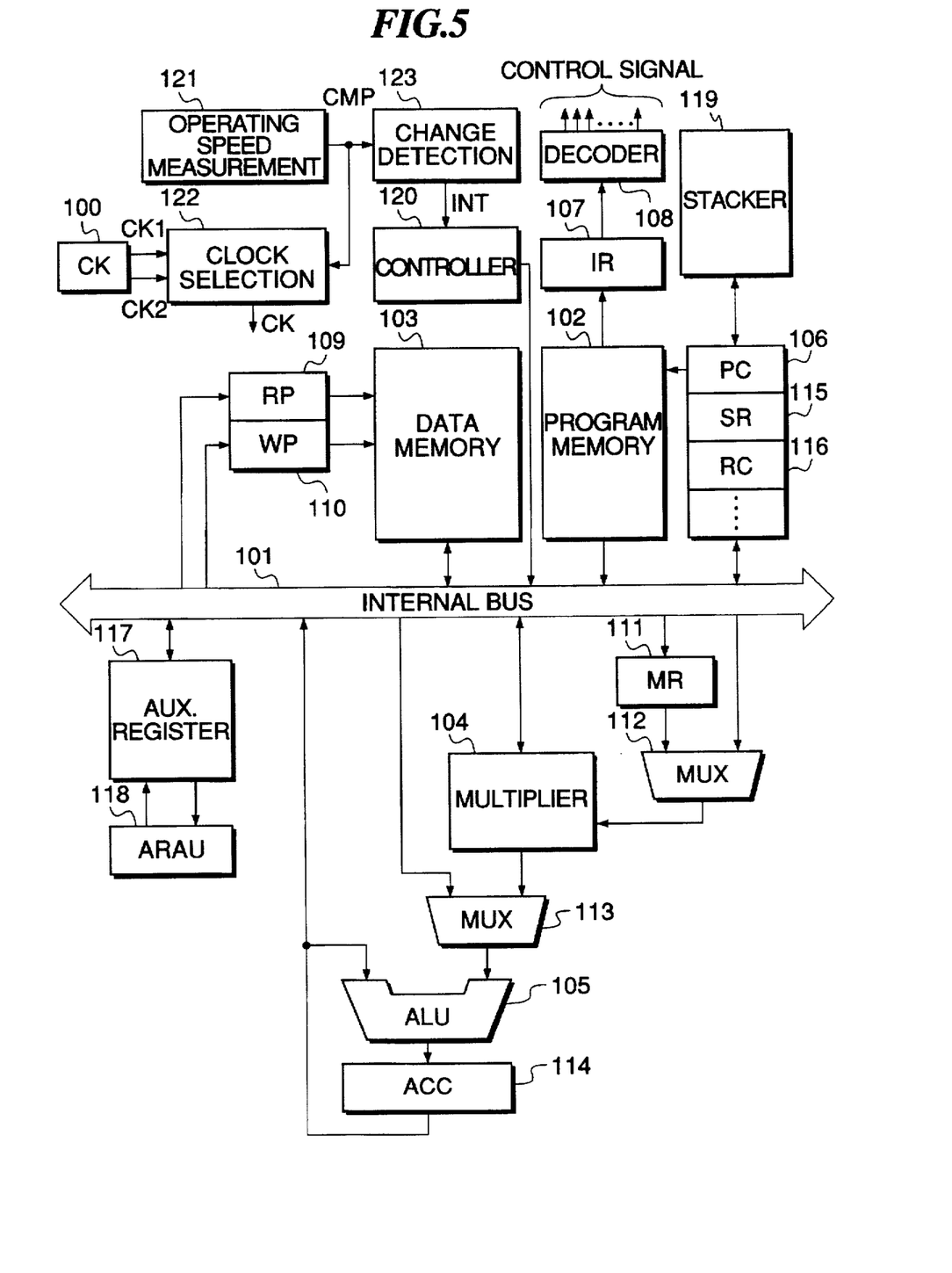
FIG. 5 is a block diagram showing the arrangement of a processor as an electronic circuit with an operation self-control function according to a second embodiment of the invention.

FIG. 5 shows the arrangement of a processor with a processing capacity self-control function as an electronic circuit with an operation self-control function according to a second embodiment of the invention. In this embodiment, the processor is an arithmetic processor such as a DSP (Digital Signal Processor). The processor has an internal bus 101 to which are connected a program memory 102 storing operational programs, a data memory 103 storing and for storing coefficients and signal data required for arithmetic operations, a multiplier 104, an ALU (Arithmetic and Logic Unit) 105, etc., the multiplier 104 and the ALU 105 constituting a computing element. Instruction codes stored in the program memory 102 are read one by one by a program counter (PC) 106 and stored into an instruction register (IR)

107, from which they are delivered to a decoder 108 to be decoded thereby. A control signal based on the decoded codes is generated and delivered to various component elements of the processor to control them. The data memory 103 has a readout address and a write address thereof designated, respectively, by a readout pointer 109 and a write pointer 110.

Data including coefficients to be delivered to the multiplier 104 are read from the data memory 103 and stored into a multiplication register 111. Data thus stored in the multiplication register 111 or operands read from the program memory 102 and delivered through the internal bus 101 are selected by a multiplexer (MUX) 112, and the selected data or operands are supplied to one input of the multiplier 104, while signal processing data, etc. are supplied to the other input of the multiplier 104. An output from the multiplier 104 or data delivered through the internal bus 101 are selected by a multiplexer (MUX) 113, and the selected output or data are supplied to one input of the ALU 105, while an output from the ALU 105 or data delivered through the internal bus 101 are supplied to the other input of the ALU 105. The output from the ALU 105 is stored into an accumulator (ACC) 114.

Status information determined from results of arithmetic operation carried out by the ALU 105 is stored into a status register (SR) 115. A number of times of processing of a loop handling is stored into a loop counter 116. Further, the processor is provided with an auxiliary register 117 and an arithmetic unit (ARAU) 118 exclusive for the auxiliary register 117. A stacker 119 has stacked therein count values from the program counter 106 when a branching processing or a like processing occurs within the same task. Further, a controller 120 is provided to control various component elements of the processor.

The processor body is arranged and constructed as above. Further, the processor is provided with an operating speed-measuring circuit 121 formed in the same integrated circuit in which the component parts of the processor are formed, for measuring processing capacity based on an operating environment in which the processor body is placed. The operating speed-measuring circuit 121 measures the switching speed of transistors constituting the processor, and compares the measured switching speed with a predetermined value to generate a comparison result CMP. The comparison result CMP is supplied to a clock-selecting circuit 122 as well as to a change-detecting circuit 123. The clock-selecting circuit 122 selects as an operating clock CK a low-speed clock CK1 from a clock generator 100 formed e.g. of a crystal oscillator and delivers the clock CK1 to various parts of the processor when the operating speed of the processor is low, while it selects as the operating clock CK a high-speed clock CK2 and delivers the clock CK2 to the various parts of the processor when the operating speed of the processor is high. The change-detecting circuit 123 detects a change in the comparison result CMP and delivers an interrupt signal INT to the controller 120 upon detection of such a change.

Figure 6:
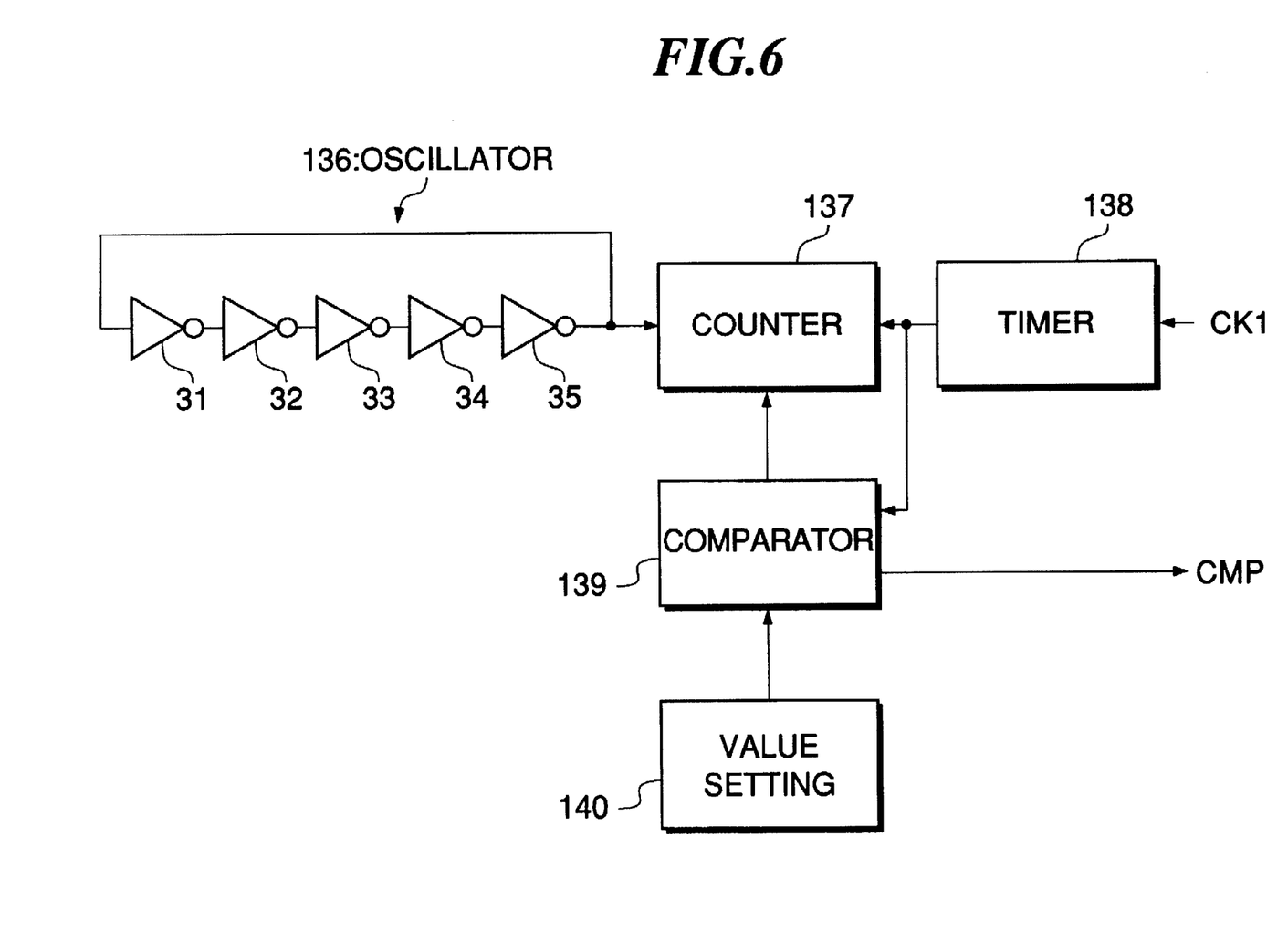
FIG. 6 is a block diagram showing the arrangement of an operating speed-measuring circuit employed in the second embodiment.

FIG. 6 shows details of the arrangement of the operating speed-measuring circuit 121. Inverters 131, 132, 133, 134, and 135 formed by MOS transistors constituting parts of the processor and are serially connected to each other and to a counter 137. These inverters constitute a feedback-type oscillator 136. An output from the oscillator 136 is counted by the counter 137. A timer 138 measures the lapse of a predetermined time period by counting the low-speed clock CK1 generated from the clock generator 100, and stops the counting operation of the counter 137 upon the lapse of the predetermined time period. A count value from the counter 137 assumed at this moment is compared with a predetermined value preset in a preset value register 140 by a comparator 139. If the count value is equal to or smaller than the predetermined value, the comparison result CMP is set to "1", whereas if the former is larger than the latter, the comparison result CMP is set to "0".

Figure 7:
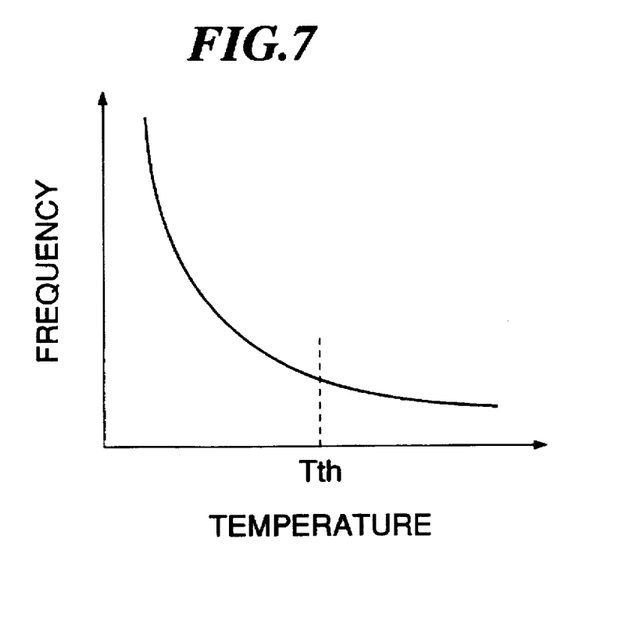
FIG. 7 is a graph showing a frequency vs. temperature characteristic of the operating speed-measuring circuit.

With the above arrangement, the switching speed of the transistors constituting the oscillator 136 lowers with an increase in the temperature, and accordingly the oscillation frequency of the oscillator 36 lowers with an increase in the temperature, as shown in FIG. 7. Therefore, when the temperature of the processor is lower than a preset value Tth, the count value of the counter 137 exceeds the predetermined value preset in the preset register 140 and hence the comparison result CMP is set to "0", whereas when the temperature of the processor exceeds the preset value Tth, the count value ≦the predetermined value holds and hence the comparison result CMP is set to "1". In the former case, the high-speed clock CK2 is supplied to various component elements of the processor to maximize the processing capacity of the processor body, while in the latter case, the low-speed clock CK1 is supplied to the various component elements of the processor body to restrict the operation of the processor body, i.e. decrease the processing amount per unit time. In this way, the processor can be driven with a processing capacity appropriate to the operating environment.

In the above arrangement, as mentioned before, the operating speed-measuring circuit 121 is formed in the same integrated circuit as the component parts of the processor, which provides the advantage that it is possible to accurately grasp the operating capacity of the processor body. However, alternatively the object of the invention may be attained by employing a temperature sensor or the like provided separately from the processor body to measure the processing capacity attributable to the operating environment.

Figure 8A:
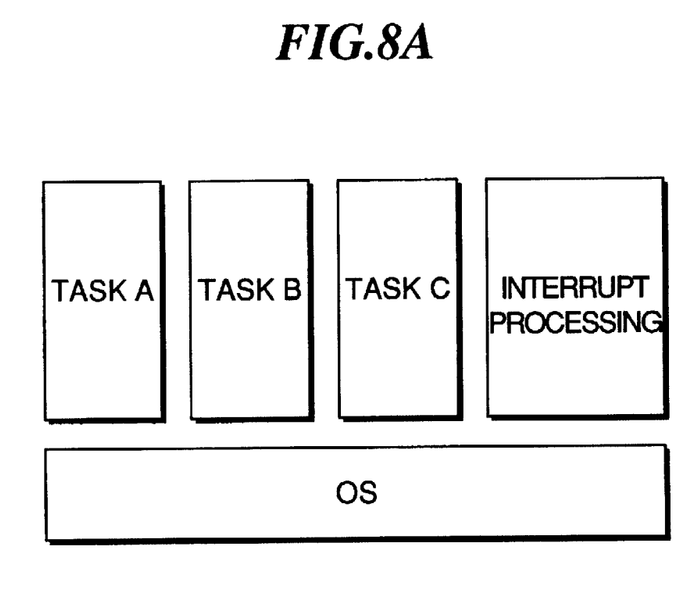
FIGS. 8A and 8B are views useful in explaining a manner of changing the processing amount of the processor in the case that the processor performs a multiple task processing.
Figure 8B:
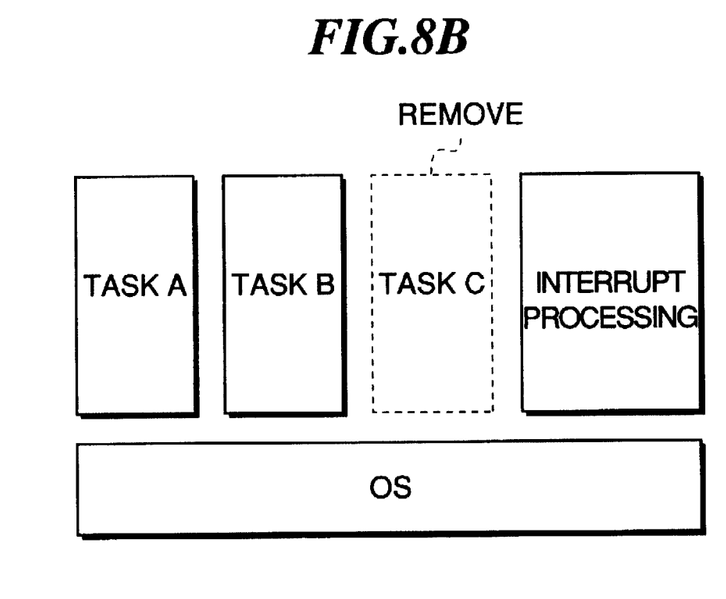

In the case where the processor carries out a multiple task processing as shown in FIGS. 8A and 8B, it may be arranged such that an interrupt signal INT is delivered from the change-detecting circuit 123 to the controller 120 whenever the comparison result CMP is changed. By thus arranging, when the temperature rises, for example, an interrupt processing is started to change scheduling shown in FIG. 8A, whereby rescheduling is carried out to remove, for example, a task C with low priority such as a picture scroll processing or degrade the priority of the task C, to thereby decrease the processing amount of the processor (processing amount per unit time).

Figure 9:
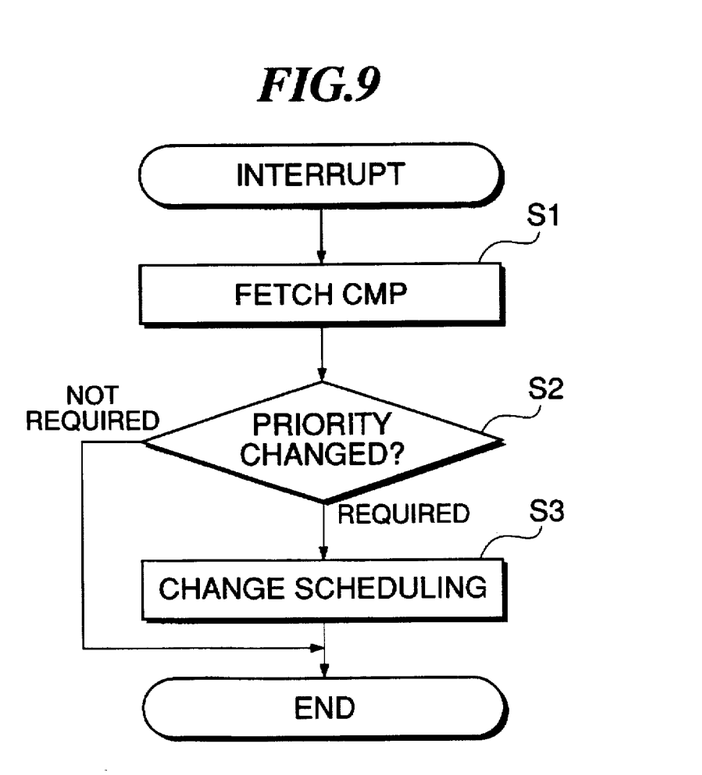
FIG. 9 is a flowchart showing an interrupt processing carried out by the processor.

FIG. 9 shows the interrupt processing mentioned above. When the interrupt processing is started, the comparison result CMP is fetched at a step S1. Then, it is determined at a step S2 whether or not there is a necessity for changing the priority of any task. If there is such a necessity, rescheduling is executed at a step S3. In this way, the processing amount can be controlled.

In the present embodiment, the processing capacity of the processor is controlled depending upon the detected temperature. However, driving voltage for driving the processor may be detected by a voltage sensor to properly control the processing capacity in a similar manner to that described above.

According to the second embodiment described above, the processing capacity attributable to the operating environment is detected by processing capacity-detecting means (operating speed-measuring circuit 121), and the processing amount per unit time of the processor is controlled by control means (clock-selecting circuit 122; steps S1–S3) according to the detected processing capacity. As a result, the processing capacity of the processor can be exhibited to the maximum extent according to the operating environment.

What is claimed is:

1. An electronic circuit with an operation self-control function comprising:

an electronic circuit body;

operating parameter-detecting means for detecting a value of an operating parameter indicative of an operating condition of said electronic circuit body, wherein said operating parameter-detecting means detects a processing capacity of said electronic circuit body attributable to an operating environment in which said electronic circuit body operates, and wherein said operating parameter-detecting means includes a temperature sensor for sensing a temperature of said electronic circuit body;

self-control means for restricting operation of said electronic circuit body according to the detected value of said operating parameter; and clock-generating means for generating a clock on which said electronic circuit body operates, wherein said self-control means is responsive to the detected value of said operating parameter, for varying a frequency of said clock from said clock-generating means to self-restrict operation of the electronic body in correspondence with the varying frequency, and wherein said self-control means controls a processing amount per unit time of said electronic circuit body according to the detected processing capacity.

2. An electronic circuit as claimed in claim 1, wherein said operating parameter-detecting means is provided in said electronic circuit body.

3. An electronic circuit as claimed in claim 1, wherein said self-control means lowers the frequency of said clock when the detected temperature of said electronic circuit body exceeds a predetermined value.

4. An electronic circuit with an operation self-control function comprising:

an electronic circuit body;

an operating parameter-detecting means for detecting a value of an operating parameter indicative of an operating condition of said electronic circuit body, wherein said operating parameter-detecting means detects a processing capacity of said electronic circuit body attributable to an operating environment in which said electronic circuit body operates, and wherein said operating parameter-detecting means includes a temperature sensor for sensing a temperature of said electronic circuit body;

a self-control means for restricting operation of said electronic circuit body according to the detected value of said operating parameter; and a clock-generating means for generating a clock on which said electronic circuit body operates, wherein said self-control means is responsive to the detected value of said operating parameter, for varying a frequency of said clock from said clock-generating means to self-restrict operation of the electronic body in correspondence with the varying frequency, and wherein said electronic circuit body has a plurality of different functions, and said self-control means inhibits execution of at least one of said plurality of different functions when the detected temperature of said electronic circuit body exceeds a predetermined value.

5. An electronic circuit as claimed in claim 1, wherein said electronic circuit body carries out a plurality of different tasks, and said self-control means inhibits execution of at least one of said plurality of said different tasks, depending upon the detected processing capacity.

6. An electronic circuit as claimed in claim 1, wherein said electronic circuit body carries out a plurality of different tasks, and said self-control means changes priority of at least one of said plurality of said different tasks, depending upon the detected processing capacity.

7. An electronic circuit as claimed in claim 1, wherein said electronic circuit is an integrated circuit.

8. An electronic circuit as claimed in claim 1, wherein said electronic circuit is a processor.

9. An electronic circuit with an operation self-regulating function comprising:

an electronic circuit body;

an operating parameter-detecting circuit that detects a value of an operating parameter indicative of an operating condition of the electronic circuit body, wherein the operating parameter-detecting circuit detects a processing capacity of the electronic circuit body attributable to an operating environment in which the electronic circuit body operates, and wherein the operating parameter-detecting circuit includes a temperature sensor that senses a temperature of the electronic circuit body;

a self-control circuit that restricts operation of the electronic circuit body according to the detected value of the operating parameter;

a clock-generating circuit that generates a clock on which the electronic circuit body operates, and wherein the self-control circuit is responsive to the detected value of the operating parameter, to vary a frequency of the clock from the clock-generating circuit to self-restrict operation of the electronic body in correspondence with the varied frequency, and wherein said self-control circuit controls a processing amount per unit time of the electronic circuit body according to the detected processing capacity.

10. An electronic circuit in accordance with claim 9, wherein the operating parameter-detecting circuit is provided in the electronic circuit body.

11. An electronic circuit in accordance with claim 9, wherein the self-control circuit lowers the frequency of the clock when the detected temperature of the electronic circuit body exceeds a predetermined value.

12. An electronic circuit with an operation self-control function comprising:

an electronic circuit body;

an operating parameter-detecting means for detecting a value of an operating parameter indicative of an operating condition of said electronic circuit body, wherein said operating parameter-detecting means detects a processing capacity of said electronic circuit body attributable to an operating environment in which said electronic circuit body operates, and wherein said operating parameter-detecting means includes a temperature sensor for sensing a temperature of said electronic circuit body;

a self-control means for restricting operation of said electronic circuit body according to the detected value of said operating parameter; and a clock-generating circuit that generates a clock on which the electronic circuit body operates, and wherein the self-control circuit is responsive to the detected value of the operating parameter, to vary a frequency of the clock from the clock-generating circuit to self-restrict operation of the electronic body in correspondence with the varied frequency.

wherein the electronic circuit body has a plurality of different functions, and the self-control circuit inhibits execution of at least one of the plurality of different functions when the detected temperature of the electronic circuit body exceeds a predetermined value.

13. An electronic circuit in accordance with claim 9, wherein the electronic circuit body carries out a plurality of different tasks, and the self-control circuit inhibits execution of at least one of the plurality of the different tasks, depending upon the detected processing capacity.

14. An electronic circuit in accordance with claim 9, wherein the electronic circuit body carries out a plurality of different tasks, and the self-control circuit changes priority of at least one of the plurality of said different tasks, depending upon the detected processing capacity.

15. An electronic circuit in accordance with claim 9, wherein the electronic circuit is an integrated circuit.

16. An electronic circuit in accordance with claim 9, wherein the electronic circuit is a processor.

17. An electronic circuit with an operation self-regulating function comprising:

an electronic circuit body;

operating parameter-detecting means for detecting a value of an operating parameter indicative of an operating condition of the electronic circuit body, wherein the operating parameter-detecting means detects a processing capacity of the electronic circuit body attributable to an operating environment in which the electronic circuit body operates, and wherein the operating parameter-detecting means includes a voltage sensor for detecting a voltage for driving the electronic circuit body;

self-control means for restricting operation of the electronic circuit body according to the detected value of the operating parameter; and clock generating means for generating a clock on which the electronic circuit body operates, and wherein the self-control means is responsive to the detected value of the operating parameter for varying a frequency of the clock from the clock generating means to self-restrict operation of the electronic body in correspondence with the varying frequency, wherein said self-control means controls a processing amount per unit time of the electronic circuit body according to the detected processing capacity.

18. An electronic circuit in accordance with claim 17, wherein the operating parameter-detecting means is provided in the electronic circuit body.

19. An electronic circuit in accordance with claim 17, wherein the electronic circuit body carries out a plurality of different tasks, and the self-control means inhibits execution of at least one of the plurality of the different tasks, depending upon the detected processing capacity.

20. An electronic circuit in accordance with claim 17, wherein the electronic circuit body carries out a plurality of different tasks, and the self-control means changes priority of at least one of the plurality of said different tasks, depending upon the detected processing capacity.

21. An electronic circuit in accordance with claim 17, wherein the electronic circuit is an integrated circuit.

22. An electronic circuit in accordance with claim 17, wherein the electronic circuit is a processor.

* * * * *